United States Patent [19]

Rhodes

[11] 4,303,886

[45] Dec. 1, 1981

[54] MAGNETIC FIELD STRENGTH MEASURING APPARATUS

[75] Inventor: Melvin H. Rhodes, Cedar Rapids, Iowa

[73] Assignee: Rockwell International Corporation, El Segundo, Calif.

[21] Appl. No.: 68,838

[22] Filed: Aug. 22, 1979

[51] Int. Cl.³ .................................... G01R 33/04
[52] U.S. Cl. .................................... 324/255
[58] Field of Search .................................... 324/253–255

[56] References Cited

U.S. PATENT DOCUMENTS 3,983,475 9/1976 Watanabe et al. .................. 324/254

FOREIGN PATENT DOCUMENTS 1207313 9/1970 United Kingdom ................ 324/253
1248567 10/1971 United Kingdom ................ 324/253

Primary Examiner—Gerard R. Strecker
Assistant Examiner—Walter E. Snow
Attorney, Agent, or Firm—Bruce C. Lutz; Richard A. Bachand; H. Fredrick Hamann

[57] ABSTRACT

A rod of magnetic material which has a very small diameter compared to its length is used in combination with a drive and output winding wound around the circumference of the core rod to provide the sensor for measuring magnetic field strength. The rod is periodically and cyclically driven to saturation in each direction by a triangular waveform drive signal generator. A point on the saturation curve in each direction of saturation is picked and the relative time between these points for a no external field condition is determined. Any deviation from this no external field condition is sensed and applied to an integrator which provides both the output signal and a feedback signal which is used in combination with the signal generator to compensate for effects of the external field on the saturation points in the sensor. When the output signal is representative of the magnetic field, there is again no deviation in the time of occurrence of saturation in the rod from the no external field condition.

3 Claims, 13 Drawing Figures

MAGNETIC FIELD STRENGTH MEASURING APPARATUS

The present invention is related generally to electronics and more specifically to electronics in combination with a magnetic field sensor for measuring magnetic field strength. More specifically, the present invention is directed toward apparatus for measuring magnetic field strength along the axis of a rod of magnetic material having a large length-to-diameter ratio.

Although there are many types of magnetic field strength sensors in the prior art, it is believed that the present invention and its related co-pending variations Ser. Nos. 68,840, 68,839 and 68,831, all assigned to the same assignee as the present invention and filed on the same date, provide greater directional sensitivity along with less circuitry and smaller total package dimensions than the prior art.

The present sensor uses a magnetic core in the form of a rod which has a length-to-diameter ratio which is large and in one embodiment of the invention is around 200. This same type sensor is used in the cases referenced above. The magnetic core has one coil wound on top of the other where each of the coils also has a small diameter compared to the length of the core. In one embodiment of the invention, the magnetic material used in the core was of a nickel type iron that generally has a permeability in the order of 100,000 until it saturates and then the permeability drops to 1,000 or less. The principle of the sensing circuit is to drive the core well into saturation in both directions. The windings and detection circuitry are designed such that an output is detected only when the permeability of the core rises to a given value. When this value is reached, an output pulse is provided until the permeability again drops below the given value. The time between occurrences of the output pulses is then used as an indication of a balanced or unbalanced condition in the core. Feedback is used to normally keep the core in a balanced condition until there is some change in external field. An integrator is used to accumulate the past deviations from a balanced condition and maintain an output indicative of the present external magnetic field whose effect on the core is balanced by the feedback signal.

It will be recalled that the property of retentivity of a magnetically hysteretic material causes the magnetic flux in said material to lag the magnetization field. Such lag is generlly not considered a time lag but may be so considered in relation to the magnetization field that is changing with time. In the absence of influence by an external field (such as the earth's field) the positive going zero crossing of the flux lags the magnetizing field by the same amount as the negative going zero crossing of the flux lags the magnetizing field assuming that saturation occurs in each direction between zero crossings. However, if the magnetizing field contains a steady state or DC component and an alternating component, the lag for both directions will be the same for the total field but with respect to the applied alternating field one lag will be longer than the other one. Moreover, depending on the various factors involved, one lag can even be considered negative, i.e., can be a phase lead. This difference in phase lag, or differential phase lag as it is herein referred to, makes it possible to detect a steady state field and the direction of that field.

Part of the concept of the present invention is the use of a rod of magnetic material of such a design that the magnitude or strength of the field being sensed significantly affects the magnitude of the excitation field required to produce a saturation of the magnetic core. An external field in the longitudinal direction of the core will require that the excitation field magnitude required to produce a given level of saturation will be different in one direction than in the other by a magnitude equal to twice the component of the external field affecting or acting upon the core. By definition in this application, saturation is when the incremental permeability of the core drops below a given value. The excitation field is produced by current in a winding on the rod or core with the current changing at a given and constant rate so that the induced voltage is greater than a specified value as long as the core incremental permeability is greater than a given specified value. The excitation field is reversed on a periodic basis with the excitation being such the saturation always occurs in one direction of excitation and normally occurs in both directions of excitation. On a slightly different aspect of the present invention, it has been determined that if a magnetic rod is used with a very large length-to-diameter ratio, or in other words, very long compared to its diameter, its permeability at the center of the core will be very nearly equal to the permeability of the core material. The field acting on the center of the core is given by the equation:

$$H = H_0 - \frac{N(B-H)}{4\pi}$$

where H is the field acting at the center of the rod, $H_0$ is the field in the sensing apparatus, $N/4\pi$ is the demagnetizing factor as determined from a set of data which may be found on page 846 of the book, "Ferromagnetism" by Bozorth published in 1951 by D. Van Nostrand Company, Inc., where $\mu$ is much larger than 150, and m is the length-to-diameter ratio of the magnetic rod. For an m ratio of 200 to 1, the value of $N/4\pi$ is 0.0001.

For the present invention, the interest is focused on the change of incremental permeability as the core goes into saturation. The permeabilty of the core material when using a high-mu 80 material will change from 100,000 to 1,000 as the field across the material is increased. As set forth in the referenced book by Bozorth, $$1/\mu' = 1/\mu + N/4\pi$$

where ($\mu'$) is the apparent permeability, ($\mu$) is the permeability of the material, and $N/4\pi$ is the demagnetizing factor provided in the material of FIG. 19-4b on page 847 of the referenced book.

It has ben found by calculations, that for m=200 and $N/4\pi=0.0001$, that where $\mu$ equals 100,000, $\mu'$ equals 9090, where $\mu$ equals 10,000, $\mu'$ equals 5,000 and where $\mu$ equals 1,000, $\mu'$ equals 909.

In practicing the invention, it has been found that the field required to decrease the permeability of the core material to 5,000 requires about 0.1 oersted and the earth's field maximum value is approximately 0.6 oersteds. Since the two fields can sum the drive capabilities for the core will be 0.7 oersteds maximum plus the magnetizing factor $N/4\pi$ as determined by the above reference. Although it is not believed necessary to provide the calculations, it has been found that the field at the center of a coil, with a long length-to-diameter ratio is:

$$H_0 = 1.26NI$$

where N is the turns per centimeter for the coil, $H_0$ is the field in the sensing apparatus as previously indicated and I is the current in the coil. If number 40 wire is used and the turns per centimeter is about 100, the resultant peak current required is approximately 0.0246 amperes. The peak-to-peak current requirements will be in the range of 0.04 amps. If it is desired that the frequency be approximately 400 hertz for excitation as in the preferred embodiment, then the rate of change for the current should be 0.040÷by 0.00125 or approximately 31.7 amperes per second rate of change.

The preferred embodiment of the present invention uses a triangular excitation current signal to provide the excitation field. This produces a linear change of current through a coil that has a small diameter-to-length ratio for the magnetic material enclosed therein. Due to characteristics of the magnetic material coacting with the coil, the output signal will occur during the maximum permeability period of the core. The presence of an external magnetic field will alter the time symmetry relative the excitation current of the occurrence of maximum permeability. This alteration will reduce or increase time between two specific pulses depending upon the direction of the external magnetic field relative to the direction of the field as generated or induced by the excitation coil. The magnitude of the alteration is dependent upon the magnitude of the external magnetic field.

In view of the above, the present invention uses logic circuitry to measure the time delay or time symmetry for a determination of the magnetic field. The preferred embodiment measures the permeability near the zero crossing of the excitation field and the output signal from the coil. However, it will be apparent that other reference points may be utilized.

Since very small magnetic fields must be measured, it is desirable to have the measuring apparatus be as sensitive as possible. Thus, the unit is made very sensitive and the detected delay alteration is supplied to an integrator which retains a total history of the sensing unit. The output of the integrator is then used as a feedback signal to substantially exactly counteract the effects of the external magnetic field whereby the delay being detected by the circuitry at any given moment in time is normally very minimal. On the other hand, the integrator output, since it represents the total history of the sensing unit, provides an indication of the total magnetic field in the area of the sensing device.

As will be observed from a reading of the specification, the integrating device may be either analog or digital in the practice of the invention. As used in this specification, saturation is defined as a condition of the magnetic core wherein a given change in the field H produces a very small change in magnetic flux B as compared to the change in magnetic flux B for the same change in magnetic field H when there are comparatively few lines of flux in the core. It is to be realized, therefore, that while many definitions of saturation use this meaning, true saturation could also be defined as the point at which there is no further change in permeability with large changes in field intensity. The change in flux density per unit change in field as used herein will be defined as incremental permeability.

In view of the above, it is an object of the present invention to provide an improved magnetic field strength sensing apparatus.

Other objects and advantages of the present invention will be apparent from a reading of the specification and appended claims in conjunction with the drawings wherein:

Figure 1:
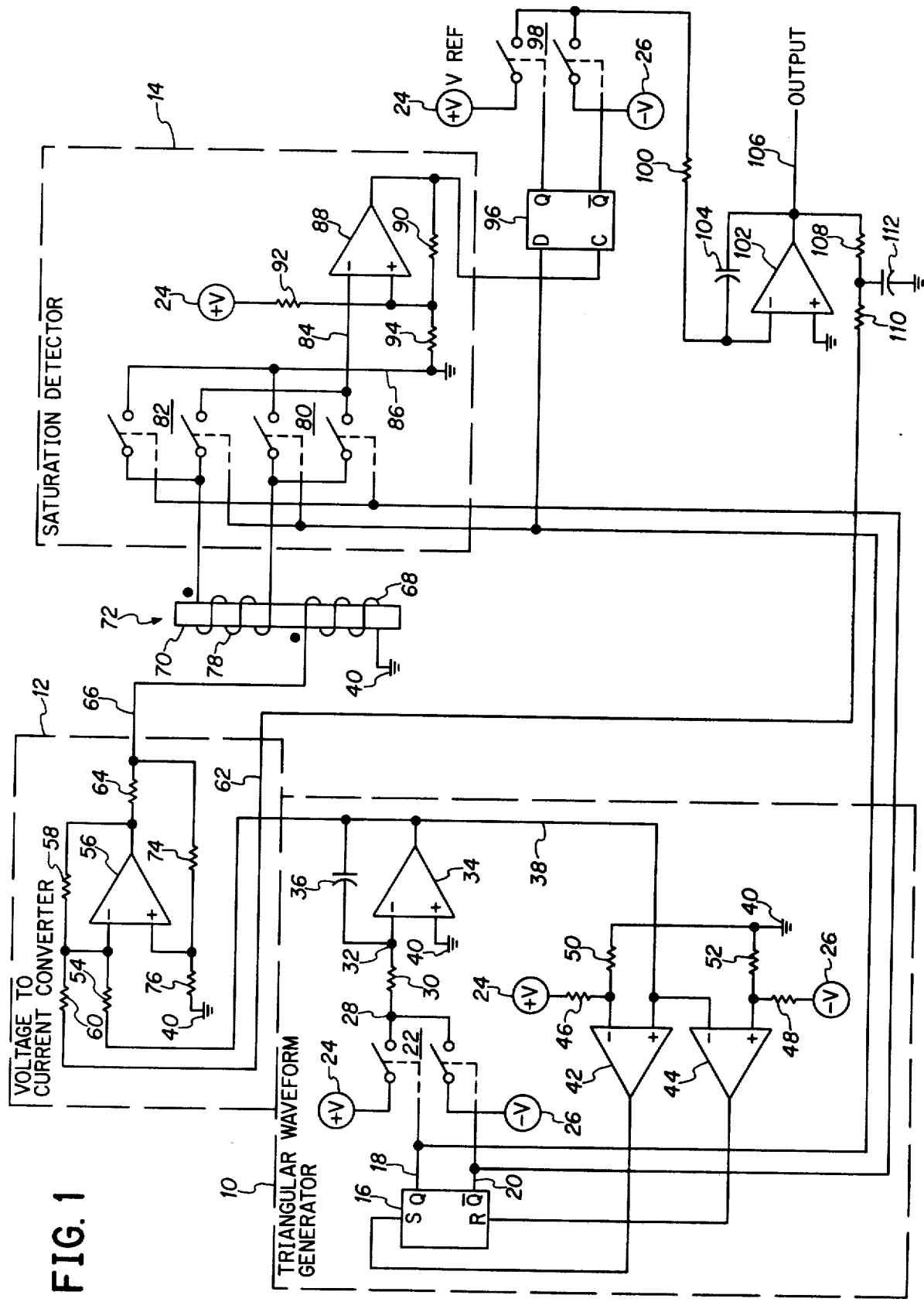
FIG. 1 is a schematic diagram of one embodiment of the invention using a single comparator.
Figure 3:
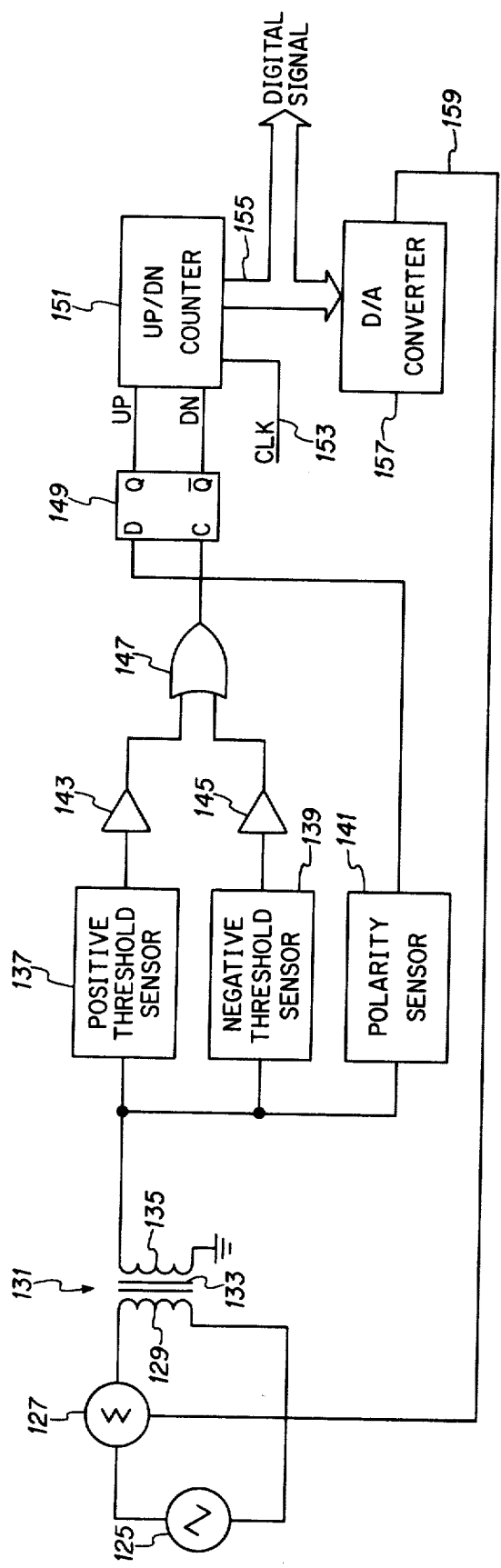

FIG. 3 comprises a block diagram of a further magnetic field strength sensing circuit using substantially the same concept as in FIG. 1 and using digital techniques for the integrating section; and FIGS. 4a–4c comprise a set of waveforms used in explaining the operation of FIG. 3.

DETAILED DESCRIPTION

In FIG. 1, a dash line block 10 is labeled triangular waveform generator, a further dash line block 12 is labeled voltage-to-current converter and a final dash line block 14 is labeled saturation detector. Within the generator 10 is illustrated a set reset flip-flop 16 with Q and $\overline{Q}$ outputs connected to leads 18 and 20. Signals on leads 18 and 20 operate switches generally designated as 22 which are connected to positive and negative voltage sources respectively. The outputs of the switches 22 are connected together at a junction point 28. A resistor 30 is connected between junction point 28 and a junction point 32 which also happens to be connected to an inverting input of an operational amplifier 34. A capacitor 36 is connected between an output lead 38 of operational amplifier 34 and its inverting input. The non-inverting input of amplifier 34 is connected to ground 40. Lead 38 is also connected to a non-inverting input of an operational amplifier 42 as well as to an inverting input of an operational amplifier 44. These amplifiers have their remaining inputs connected to positive and negative voltage sources 24 and 26 as shown through respective resistors 46 and 48. Further resistors 50 and 52 connect these inputs of operational amplifiers 42 and 44 to ground 40. An output of operational amplifier 42 is connected to the set input of flip-flop 16 while an output of operational amplifier 44 is connected to the reset input of flip-flop 16. Lead 38 is also connected through a resistor 54 to an inverting input of an operational amplifier 56 within converter 12. A feedback resistor 58 is connected between the output of operational amplifier 56 and the inverting input thereof. A further resistor 60 is connected between the inverting input of operational amplifier 56 and a lead 62. The output of amplifier 56 is connected through a resistor 64 to a lead 66 which is connected to a first winding 68 on a magnetic rod 70 forming a part of magnetic sensor 72. The other end of winding 68 is connected to ground 40. A resistor 74 is connected between lead 66 and a non-inverting input of amplifier 56. A further resistor 76 is connected between the non-inverting input of amplifier 56 and ground 40. A second winding 78 on sensor 72 has one end connected to a pair of switches 80 and the other end connected to a pair of switches 82. Half of each of these pairs of switches 80 and 82 are operated in accordance with signals received on lead 20 while the other half of each of these pairs of switches is operated by signals received on lead 18. The outputs of these two switches appear on leads 84 and 86 where 86 is connected to ground 40 and 84 is connected to an inverting input of an operational amplifier 88 used as a comparator. A feedback resistor 90 is used between the output of amplifier 88 and the non-inverting input. A pair of resistors 92 and 94 are used as a voltage divider between positive voltage source 24 and ground 40 with an intermediate point connected to the non-inverting input of comparator 88. The output of amplifier 88 is also connected to a clock input of a D flip-flop 96 which has its D input connected to lead 18. The Q and $\bar{Q}$ outputs of D flip-flop 96 are connected to a set of switches generally designated as 98 connected to the positive and negative voltage sources 24 and 26. The outputs of the two switches 98 are connected together and applied through a resistor 100 to an inverting input of an operational amplifier 102 which is used in combination with a feedback or integrating capacitor 104 such that amplifier 102 functions as an integrator. An output of amplifier 102 provides the apparatus output signal on a lead 106 which provides an indication of magnetic field strength. The output 106 is also connected through a filter comprising a resistor 108, a resistor 110 and a capacitor 112 to lead 62.

Figure 2:
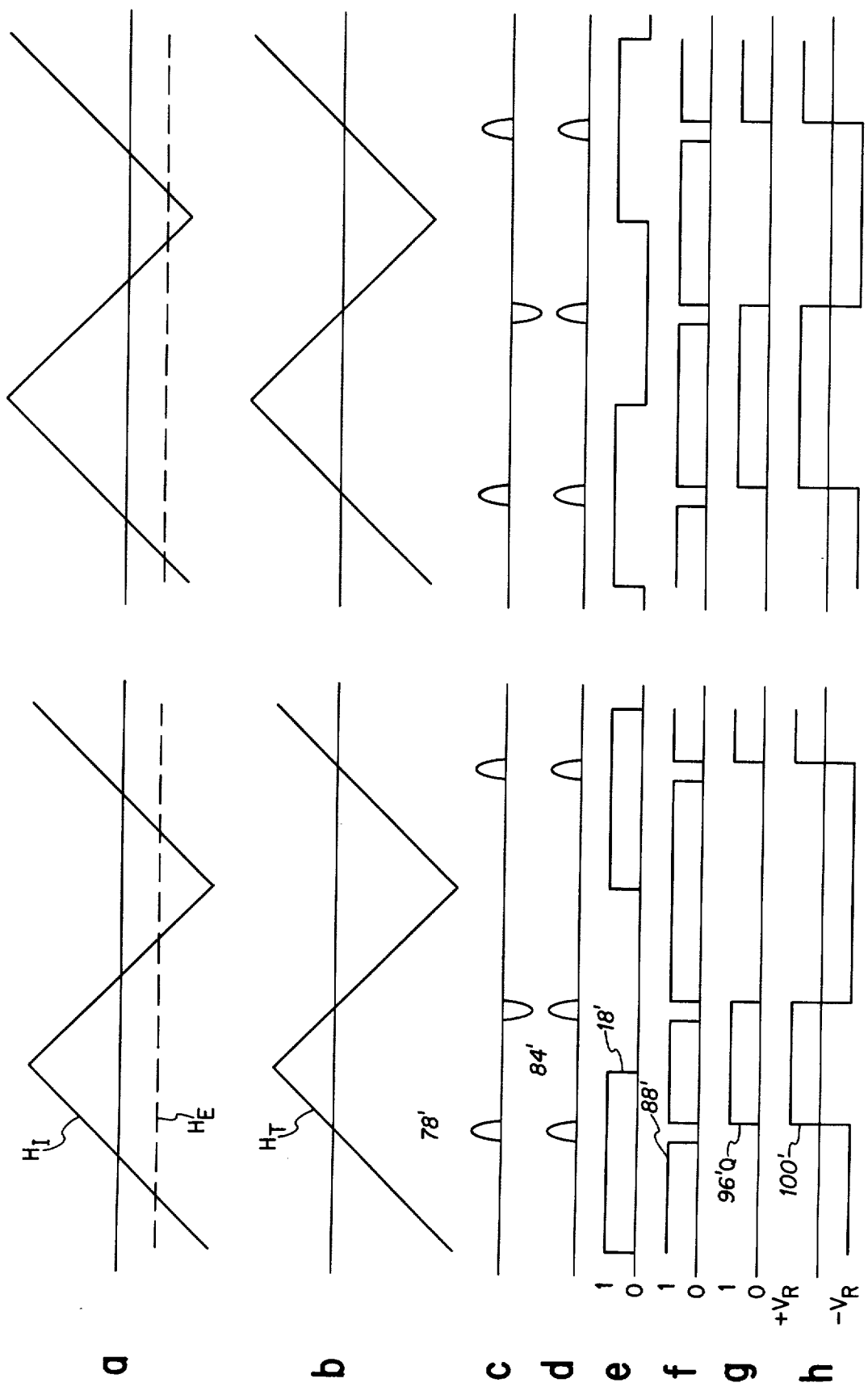
FIGS. 2a–2h are a set of waveforms used in explaining the operation of FIG. 1.

In FIG. 2, the various waveforms are given designations for use in referencing their appearance in FIG. 1. The $H_I$ waveform of FIG. 2a indicates the field produced in the core 70 of sensor 72 by the triangular waveform generator 10. As also illustrated herein, this waveform may contain a DC component or bias. The dash line $H_E$ represents the external field acting upon the sensor 72. Waveform $H_T$ in FIG. 2b represents the total flux in the core and is the combination of $H_I$ and $H_E$. The FIG. 2c waveforms illustrate the signal obtained from winding 78 while the waveform of FIG. 2d is the signal appearing on lead 84 in the saturation detector. The waveform in 2e is the signal appearing on the Q output of flip-flop 16. The waveform of FIG. 2f represents the signal at the output of amplifier 88. The waveform of 2g is indicative of the signal appearing on the Q output of D flip-flop 96 while the waveform at 2h is indicative of the signal passed through resistor 100.

In FIG. 3, a triangular waveform generator 125 supplies signals through a summing network 127 to a primary winding 129 of a magnetic sensor 131 having a core 133 and a secondary winding 135. The components 125, 127, and 131 may be of substantially the same fashion as found in blocks 10 and 12 in combination with sensor 72. The secondary winding 135 is connected to supply signals to a positive threshold sensor 137, a negative threshold sensor 139 and a polarity sensor 141. The outputs of the two sensors 137 and 139 are supplied through inverting blocks 143 and 145 to a NOR gate 147 which supplies inputs to a clock (C) input of a D flip-flop 149. The D input of flip-flop 149 is supplied from the polarity sensor 141. The Q and $\bar{Q}$ outputs of D flip-flop 149 are labeled up and down respectively and are both applied to an up/down counter 151. A relatively high speed clock input is supplied on a lead 153 to counter 151 which supplies a plurality of outputs in parallel on a set of leads 155. Leads 155 provide a digital output signal indicative of the total external field being sensed and also supply these same signals to a D/A converter (digital-to-analog converter) 157 which converts the digital signal to an analog signal. This analog signal is supplied on a lead 159 to be summed in summing circuit 127.

In the waveforms of FIG. 4a, one waveform is labeled 135' as being indicative of the output signal from winding 135 and the other a triangular waveform, is representative of that from signal generator 125. The waveform of FIG. 4b represents the output from NOR gate 147 while the waveform of 4c is indicative of the output signal on the Q output of 149.

OPERATION

The simplified description of the operation of FIG. 1 is that a triangular waveform generator 10 produces a triangular wave which is applied to a voltage-to-current converter 12. This converter 12 converts the voltage to a current and sums in a feedback signal appearing on lead 62 and applies this waveform to winding 68 of sensor 72. The feedback signal on lead 62 introduces a bias to the applied waveform. The triangular waveform sends the magnetic core 70 of the sensor 72 into saturation in both directions. The application of the triangular waveform changes the permeability of core 70 from a high point when there is a near minimum number of lines of force to a low when there is a maximum number of lines of force. The greater the change in permeability with a given change in current through winding 68, the greater is the peak output voltage obtained from winding 78. The output from a winding is a volt-second product value which is expressed by the equation:

$$e\Delta t = N\Delta\phi \times 10^{-8}$$

$\Delta\phi$ is equal to the total number of maxwell or lines in one direction to the other direction. As long as the core is driven into saturation the permeability of the core does not make any difference. However, as to the total volt second product, the field required to drive the core to saturation is much less when the permeability is high. As a practical matter with the number of turns used on windings 68 and 78, an output voltage is obtained only during a short period intermediate the extremes of each triangular waveform sweep. These occurrences of output voltage from winding 78 are detected by the comparator 88 and applied through the D flip-flop 96 to the integrator utilizing amplifier 102. When there is no external field, the occurrence of the pulses from winding 78 are time symmetrical (equally spaced in time of occurrence) and due to the logic design of the circuitry, the integrator provides a zero output on lead 106. In such an instance, there is no feedback signal on lead 62 and thus the signal applied to winding 68 is symmetrical around ground 40. As an external field is applied to affect the core 70, the time symmetry of output pulses is altered and this alteration is detected and stored in the integrator 102 to provide an output indicative of the external field. However, this output is fed back so as to compensate for the external field and again return the system to a time symmetrical output condition from the sensor. If the external field is again removed, the non-symmetry occurs in the opposite direction so as to reduce the integrator output to zero. This process is continued until the system is again balanced.

The comparator 88 operates by comparing the input signal on lead 84 against a reference determined by the voltage divider of resistors 92 and 94. Whenever the input from winding 78 falls from a high level to a low level and past the reference level, the D flip-flop 96 is activated to a state determined by the output of the flip-flop 16 in the triangular waveform generator.

As will be realized, the triangular waveform generator utilizes a square wave from the switches 22 as applied to the integrator utilizing amplifier 34 to produce the triangular waveform. As the triangular waveform voltage reaches predetermined limits, as determined by the comparators 42 and 44 and the bias voltages applied through the voltage dividers utilizing resistors 46, 50, 52 and 48, the square wave inputs to the integrator are altered and the triangular waveform is produced. This is converted by the voltage-to-current converter 12 and applied to winding 68.

The switches 80 and 82 effectively perform full-wave rectification so that the output of the switches as obtained from winding 78 is always zero or positive with the connections as illustrated. This is shown in the waveform of FIG. 2d.

Resistor 90 provides positive feedback around this comparator so as to provide hysteresis in the circuit.

The integrator circuit utilizing amplifier 102 is very slow and will effectively provide a DC voltage output. This voltage is filtered by the filter utilizing resistors 108 and 110 along with capacitor 112 and is used to effectively cancel the external field so as to keep the sensor 72 in its most sensitive condition relative to corresponding changes in magnetic field.

As will be noted, in FIG. 2 the lefthand portion illustrates a condition where an external field $H_E$ is suddenly applied and the circuitry has not had time to respond. In this situation, the field applied by voltage-to-current converter 12 is unbiased but in view of the external field $H_E$, the total field shown in waveform B of FIG. 2 is biased and thus the maximum permeability condition occurs at non-symmetrical times to produce the outputs shown in waveform C from winding 78. As previously indicated, these maximum permeability conditions occur when there is near minimum total flux in the core 70. These pulses are rectified by switches 80 and 82 as shown in waveform D of FIG. 2. When these pulses exceed the value applied to the non-inverting input of amplifier 88, the output drops to a logic zero until the output from winding 78 again drops below a second predetermined value (due to the hysteresis induced by resistor 90). At this time, the output from amplifier 88 suddenly rises so as to clock flip-flop 96. The D input to flip-flop 96 is obtained from lead 18 of flip-flop 16 and this lead has the voltage waveform as illustrated in waveform E of FIG. 2. Since at the time illustrated lead 18 is positive, the Q output of D flip-flop 96 goes to a positive condition. At the next occurrence of a pulse from winding 70 the lead 18 is logic zero and therefore the D flip-flop at this time changes so that the Q output is again logic zero. As will be noted, this pulse in waveform 2g issued to actuate the upper switch of the pair of switches 98 and applies a positive voltage to the integrator amplifier 102. The current representative of the waveform applied to 102 is shown as waveform 2h. This waveform is non-symmetrical and thus causes the input to integrator 102 to have a net negative effect. Due to the inversion within the amplifier, the output on 106 is positive. This value builds up until there is a net bias to the triangular waveform as illustrated in the righthand portion of FIG. 2a. This bias exactly equals that introduced by the external field $H_E$ so that the total field as illustrated in the waveform of 2b (second half), provides time symmetry to the output pulses obtained from winding 78 as shown in the righthand portion of the waveform of waveform 2e. Thus, the circuitry is balanced and there are no further inputs to integrator 102 and the stored output of integrator 102 is utilized to provide the output information indicative of the external field presently being sensed.

Figure 4:
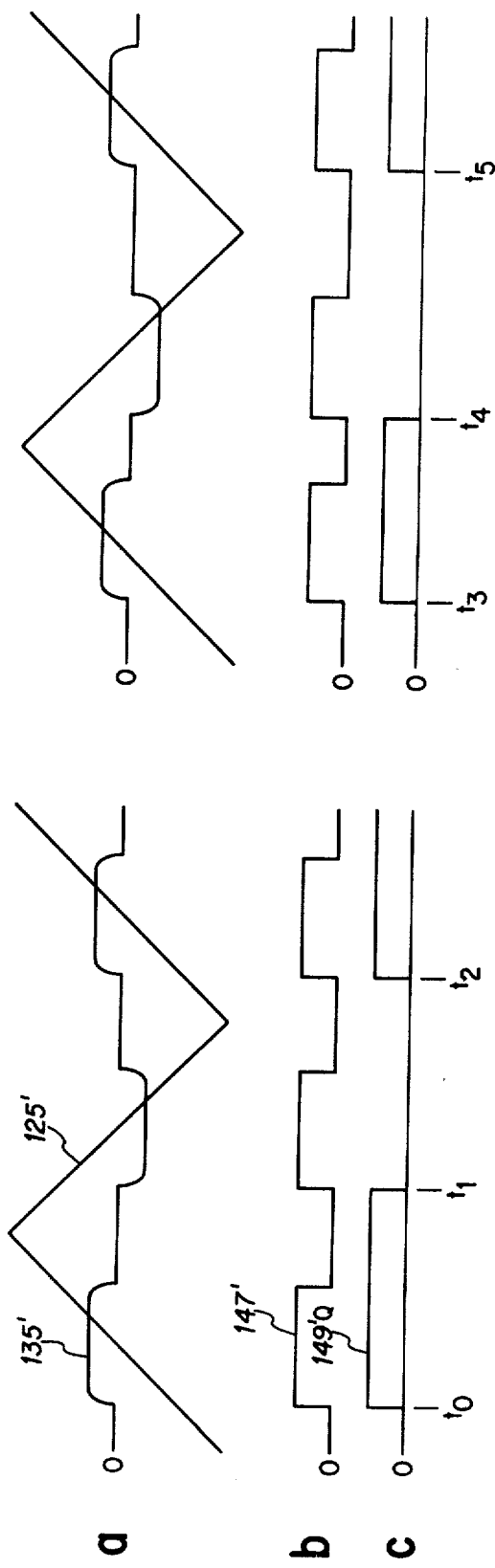

FIG. 3 operates in a manner similar to that of FIG. 1 except that positive and negative threshold sensors are utilized to detect the time of occurrence of the pulses shown as 135' in the waveform of FIG. 4a. The lefthand portion of FIG. 4 shows a balanced condition similar to that shown in the righthand portion of FIG. 2. Although the waveform 135' is illustrated as different from waveform 78' in FIG. 2, the specific shape of this output from the secondary winding depends on the number of turns on the sensor and on the triangular waveform drive mechanism. Basically, both of these sets of waveforms can be correct depending upon the specific design of an individual circuit. In any event the pulses are sensed as to both positive and negative values and are applied to actuate the D flip-flop 149 so as to activate the up/down counter 151. If the up/down counter 151 counts up for the same period as it counts down, there will be no net effect on the output of the counter over the long term. However, if the count up is shorter than the count down as illustrated in the second half of FIG. 4c, the total count for counter 151 will be reduced and such a condition will continue until the feedback signal as provided by digital-to-analog converter 157 exactly equals the external field being sensed. At this time, the conditions will again return to that illustrated in the lefthand portion of FIG. 4 and the digital output signal will again be representative of the magnetic field strength. It is to be realized that if all of the digital bits were output on lead 155, there would be a continuous changing of this value which would be disconcerting to someone attempting to read the magnitude of the field. However, if only some of the most significant bits are utilized as the output, the indicated value will appear to remain substantially constant even though it is continually counting up and down relative to the least significant digits.

As may be observed, the present invention utilizes the concept of driving the magnetic sensor to saturation in both directions and in fact driving it past saturation in both directions for each half cycle of the drive signal. A point intermediate the extremes of the drive signal is selected to be detected and the time variation from a "no external field condition" is utilized to determine the magnitude of external field being sensed. This magnitude is then fed back to bias the drive signal so as to return the sensor to a balanced state. However, the feedback signal is in itself used either in the digital or analog form to provide an output signal indicative of the external magnetic field. As illustrated, a near minimum total field condition is sensed since this is a very easy point to obtain in FIG. 1. However, as modified in FIG. 3, the point selected for timing was a given permeability value considerably prior to the minimum value. Moreover, the capability of choosing a value other than minimum permeability is not restricted to whether the unit is analog or digital but rather to design choice and system requirements.

While I have illustrated two means of practicing the present inventive concept, other approaches will occur to those skilled in the art and although for convenience I used a triangular drive, single and double voltage sensors for the output of the magnetic sensor winding and both analog and digital integrators, other variations are to be included in the scope of my invention.

I wish to be limited only by the scope of the appended claims wherein I claim:

1. Apparatus of the class described comprising, in combination:

magnetic sensor means including first and second windings;

drive means, connected to said first winding, for cyclically increasing the magnetic field in said sensor means to a value greater than that value which causes saturation in said sensor means;

detection means, connected to said second winding, for providing an output signal whenever the absolute magnitude of signals received from said second winding is greater than a predetermined value;

conversion means, connected to said detection means, for providing a bilevel output signal which changes once for each occurrence of an output signal from said detection means;

integration means, connected to said conversion means, for providing an apparatus output signal indicative of the non-symmetry history of bilevel output signals received from said conversion means; and feedback means, connected between said integration means and said drive means, for returning a feedback signal which substantially cancels the effect of an external field being measured.

2. Apparatus as claimed in claim 1 wherein said detection means comprises positive and negative threshold sensors.

3. Apparatus as claimed in claim 1 wherein said integration means comprises an up/down counter whose count direction is determined by a polarity detector associated with said detection means.

* * * * *